United States Patent

Mckee, IV

[11] Patent Number: 5,782,517
[45] Date of Patent: Jul. 21, 1998

[54] HANDLE FOR WAFER CARRIER AND DOCKING STATION

[75] Inventor: Robert E. Mckee, IV, Dallas, Tex.

[73] Assignee: Texas Instruments Incorporated, Dallas, Tex.

[21] Appl. No.: 771,457

[22] Filed: Dec. 20, 1996

Related U.S. Application Data

[60] Provisional application No. 60/009,203 Dec. 12, 1995.

[51] Int. Cl.$^6$ .................................................. B65D 25/28
[52] U.S. Cl. ........................ 294/27.1; 206/711; 211/41.18
[58] Field of Search ........................... 294/1.1, 26, 27.1, 294/33, 15; 211/41.12, 41.18; 206/710, 711; 118/500, 501, 503; 16/114 R; 414/940

[56] References Cited

U.S. PATENT DOCUMENTS

| | | | |
|---|---|---|---|
| 3,939,973 | 2/1976 | Wallestad | 206/711 |
| 5,029,922 | 7/1991 | DiNapoli et al. | 294/27.1 |
| 5,033,406 | 7/1991 | Lee | 294/27.1 |
| 5,100,190 | 3/1992 | Molinaro | 294/27.1 |
| 5,364,144 | 11/1994 | Satterfield et al. | 294/27.1 |
| 5,390,972 | 2/1995 | Galloway | 294/27.1 |

*Primary Examiner*—Dean Kramer
*Attorney, Agent, or Firm*—W. James Brady, III; Richard L. Donaldson

[57] ABSTRACT

The invention is a semiconductor handling apparatus including a handle device (10) for attaching to and lifting semiconductor wafer carriers (40) from a single end, wherein the carrier has two spaced apart slots (50A, 51A) on one end (42) and a docking station (60) for the carrier (40). The wafer carrier (40) is carried by handle 10 and is placed in a slot (62) in docking station (60) to allow a worker to carry semiconductor wafers (55) in carrier (40) to different processing stations, and docking station (60) provides a container (60a) to receive processing chemicals that drain from wafers (55).

13 Claims, 9 Drawing Sheets

HANDLE FOR WAFER CARRIER AND DOCKING STATION

This application claims the benefit of U.S. Provisional Application No. 60/009,203 filed on Dec. 12, 1995.

FIELD OF THE INVENTION

This invention relates to semiconductor manufacturing process, and more particular to a handle for a wafer carrier, and to a docking station used in conjunction with the handle.

BACKGROUND OF THE INVENTION

In processing semiconductor wafers, the wafers are placed in a carrier and then moved into and out of various heated processing baths for predetermined periods of time. Wafer carriers are designed to hold a plurality of wafers, and the carrier and wafers are placed in etching and cleaning baths to treat the wafers. To remove the carrier from the treating baths, squeeze style hands have been used. These squeeze style handles are similar to tongs or tweezers that have two arms that join together at one end. The other open end is placed adjacent a carrier and squeezed together to place the open end of the handles against and under rails at opposite ends of the wafer carrier. It has been found that a slight relaxation of pressure in squeezing the handles together may cause the wafer carrier to be released and dropped. Also, after a period of time, the plastic materials from which the handles are made lose strength and integrity due to heat in which the wafers are processed.

SUMMARY OF THE INVENTION

The invention is a semiconductor handling apparatus including a handle device for attaching to and lifting semiconductor wafer carriers from a single end, wherein the carrier has two spaced apart slots on one end and a docking station for said carrier.

The handle has a body tapered from a small end to a larger mid-section, and terminates in a section that tapers to two spaced apart legs. There is a looped handle on the small end of the handle body. A bracket device is mounted on the larger mid-section, having on each end a first section extending vertically from the midsection, and a second section extending at a right angle from said first section. The second sections extend at a right angle from said first sections and are insertable into the spaced apart slots on said wafer carrier for lifting and carrying said wafer carrier.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
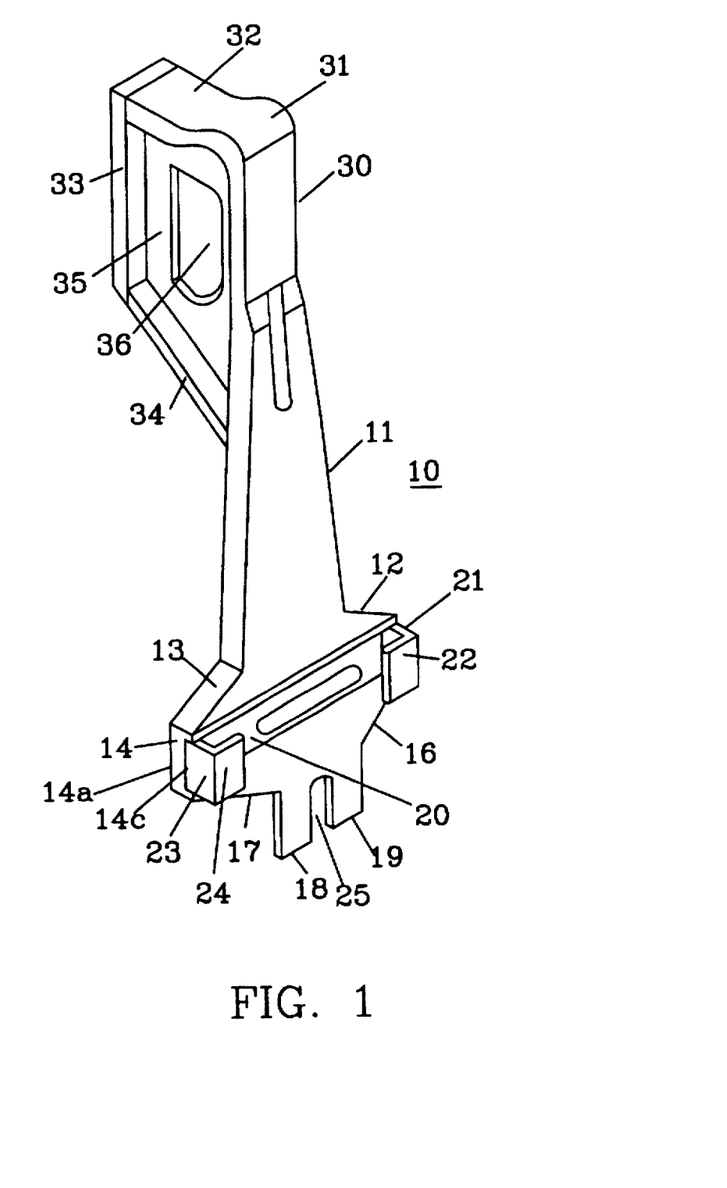
FIG. 1 is an isometric drawing of the handle of the invention.

FIG. 1 is an isometric view of a wafer carrier handle attachable to a single end of a wafer carrier. Handle 10 has a taper middle part 11 that terminates in two sloped sides 12 and 13 that slant outward to a rectangular region 14 having ends 14a and 14b. In rectangular region 14 is a slot 15 (see FIG. 2) in which is secured a "C" shaped bracket having a back 20 with part 21 and 22 forming part of the "C" shape on one end, and parts 23 and 24 forming part of the "C" on the other end. Parts 21 and 23 extend outward vertically from back part 20. Part 24 extends at a right angle from part 23, and part 22 extends at a right angle from part 21. Extending from rectangular part 14 is a tapered section having sloped sides 16 and 17 that terminate in two legs 18 and 19, separated by slot 25.

On the end of middle part 11 opposite legs 18 and 19, is a handle loop made up of front part 30, top part 32, back part 33 and bottom part 34. Within the loop of parts 32–34 is a web 35, for re-enforcing the handle loop, and opening 36 through which fingers and/or part of the hand may be placed when grasping the handle.

Figure 2:
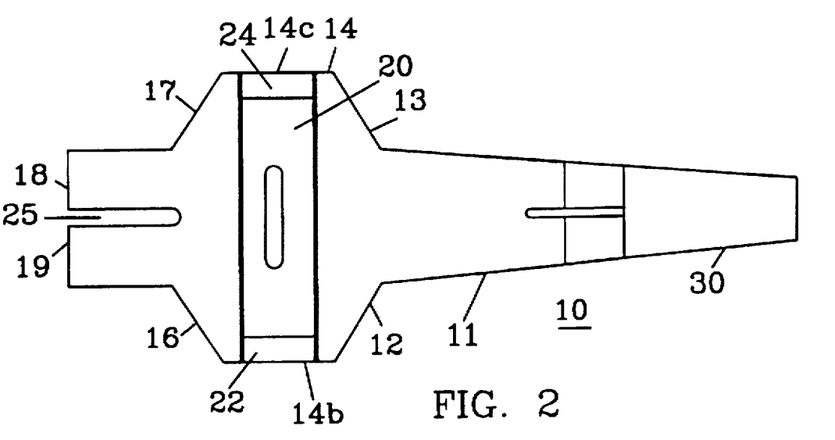
FIG. 2 is a front view of the handle.
Figure 3:
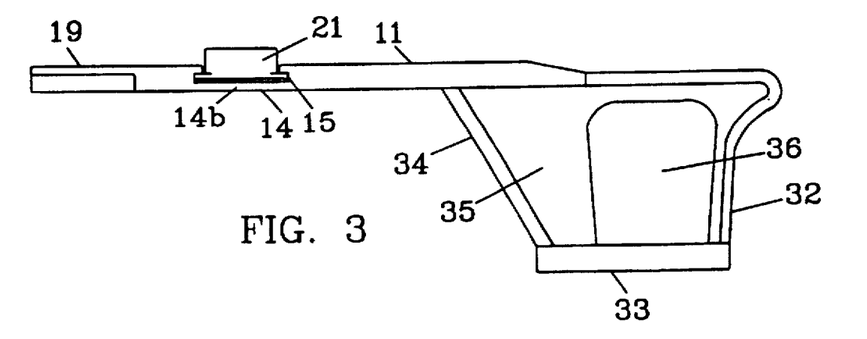
FIG. 3 is a side view of the handle.

FIG. 2 is a front view of handle 10 showing the tapered middle part 11 joined to the tapered sides 12 and 13. Rectangular part 14 has ends 14b and 14c that join tapered edges 16 and 17 and terminate in legs 18 and 19 that are separated by slot 20. In side view FIG. 3, it is seen that handle part 30 is an extension of middle part 11. The handle loop made up of parts 30, 32, 33 and 35 have an opening 36 that is surrounded by web 35. Web 35 strengthens the handle loop.

Handle 10 may be made of, for example, teflon and other heat and chemical resistant materials that will not deteriorate when exposed to and placed in the chemical baths to which semconductor wafers are subjected.

Figure 4:
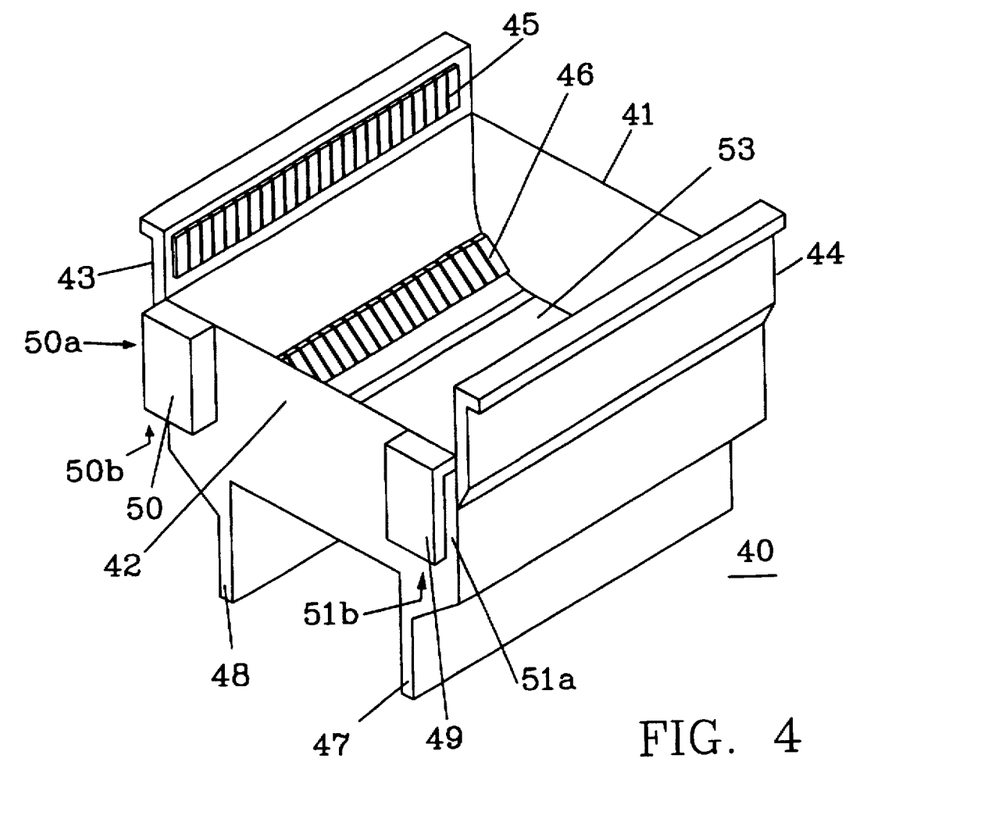
FIG. 4 is a wafer carrier used with the handle.

FIG. 4 shows a semiconductor wafer carrier 40. Carrier 40 has a generally rectangular body including sides 41, 42, 43 and 44. Inside of carrier 40 are a series of slots 45 and 46 (additional slots are on side 44) into which semiconductor wafers are placed. The bottom of carrier 40 is open at 53 to provide for drainage of wafers placed in carrier 40. Other drain openings (not illustrated) may be placed in the sides and ends of carrier 40 so that processing chemicals will not be retained in carrier 40. Carrier 40 has two support legs 47 and 48 which extend the length of carrier 40.

On end 42 of carrier 40 are two spaced apart brackets 49 and 50, each of which has a slot therein. Bracket 49 is open at 51a and at the bottom 51b forming a slot. Bracket 50 has similar openings at 50a and 50b forming a slot. These brackets are used to attach handle 10 by sliding parts 22 and 24 of handle into the slots, as described below.

Figure 5:
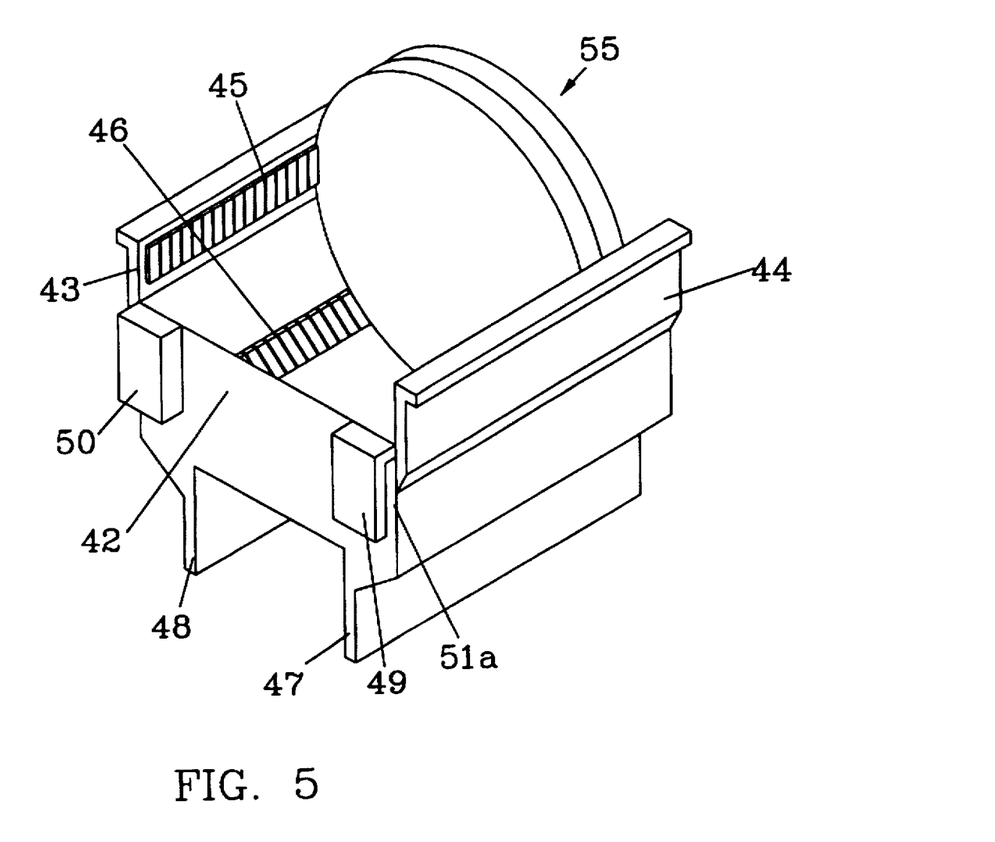
FIG. 5 shows the wafer carrier with semiconductors wafers therein.

FIG. 5 shows carrier 40 with a plurality of semiconductor wafers 55 mounted in the slots 45 and 46.

Figure 6:
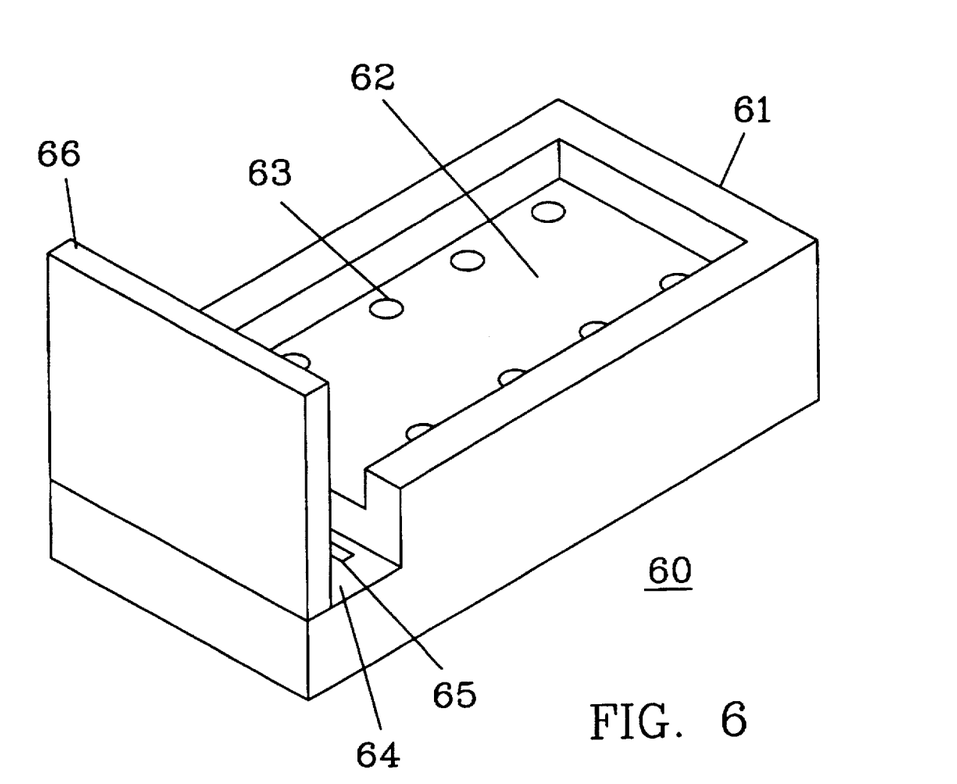
FIG. 6 is a docking station for the wafer carrier.

FIG. 6 is a docking station 60 used in conjunction with handle 10 and wafer carrier 40. Docking station 60 has a generally rectangular body 61 with a recessed area 62 in the top surface. Drain holes 63 are spaced around the bottom of recessed area 62 for moving chemcials dripping from semiconductor wafers into the interior of docking station 60. At one end of docking station 60 is a step-down region 64 with a slot 65 therein. Slot 65 receives legs 18 and 19 of handle 10 when a wafer carrier 40 is attached to handle 10 and carrier 40 is placed on docking station 60. Wall 66, secured to step-down region 64, is used in holding docking station 60 by hand and provides a support for part of handle 10. Opening 67, in the side of step-down region 64 provides a drain port for fluids accumulated in docking station 60.

Figure 7:
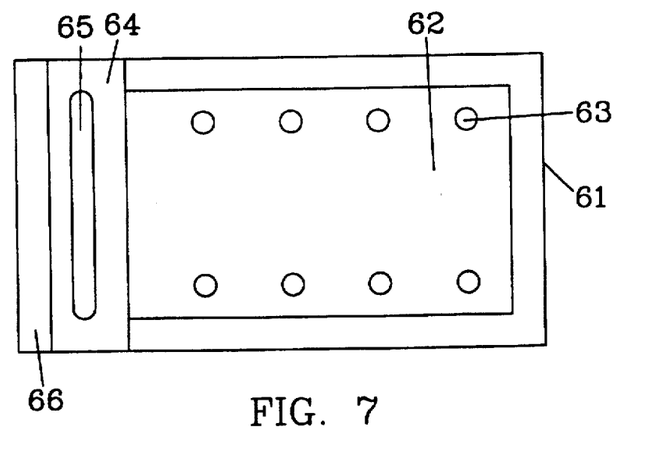
FIG. 7 is a top view of the docking station.
Figure 8:
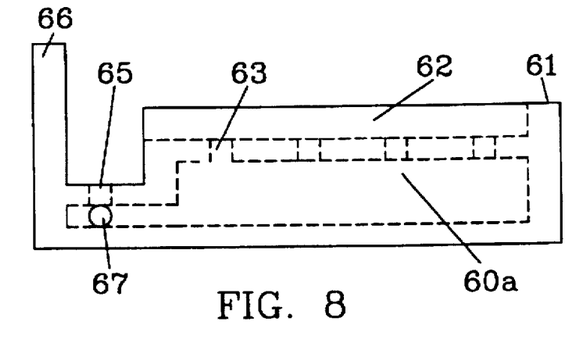
FIG. 8 is a side view of the docking station.
Figure 9:
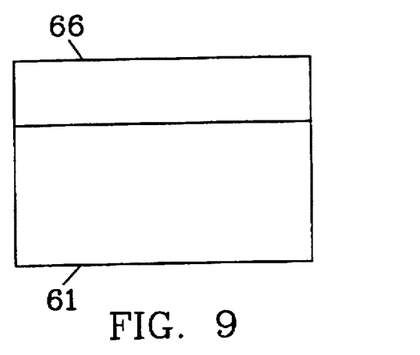
FIG. 9 is an end view of the docking station.

FIGS. 7, 8 and 9 are top, side and end views of docking station 60. In FIG. 7, slot 65 is shown partially extending across step-down region 64. In FIG. 8, the internal fluid acculmlation area 60a is shown in dashed lines, as well as the recessed area 62, and drain holes 63. Drain port 67 is shown in the side of the step-down region 64.

Figure 10:
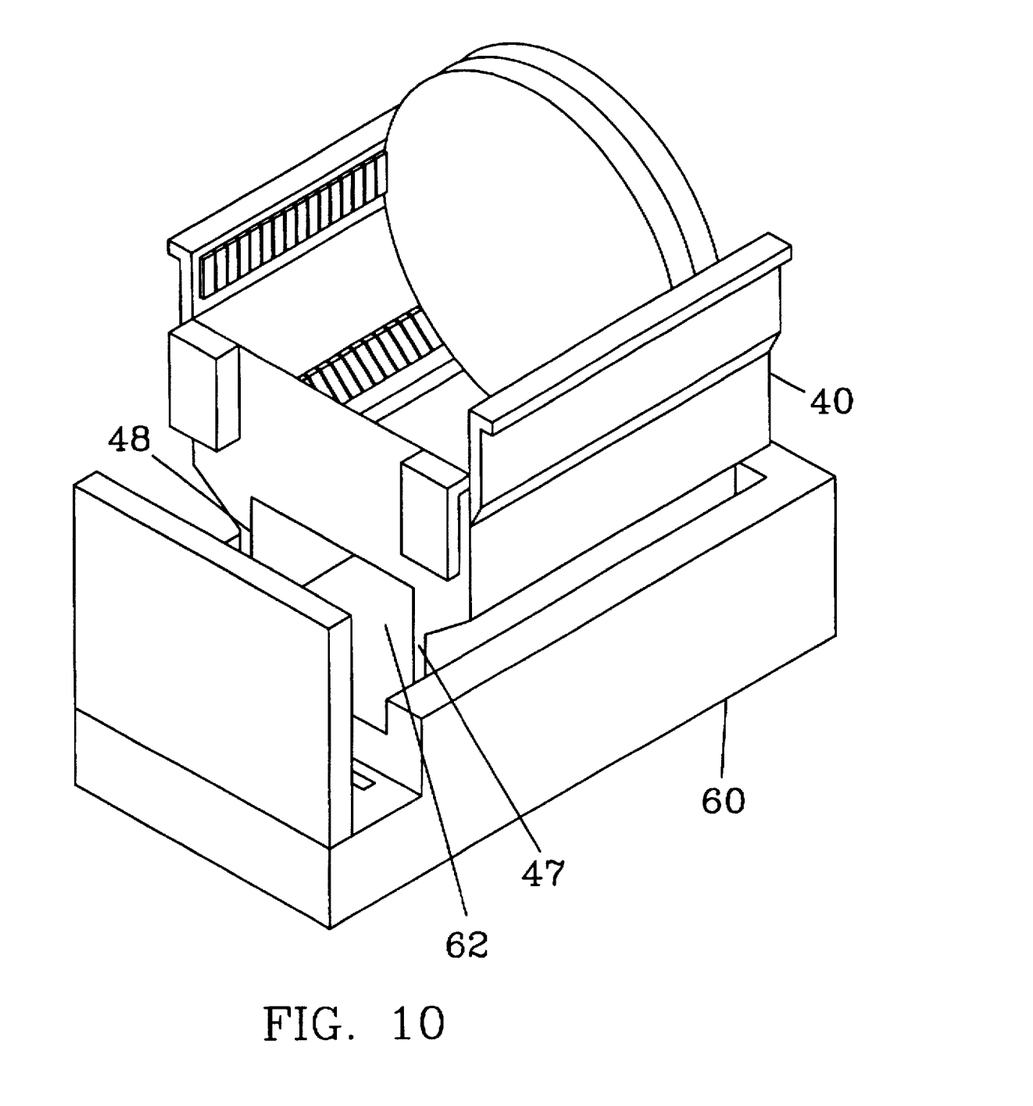
FIG. 10 shows a wafer carrier on a docking station.

FIG. 10 shows a wafer carrier 40 sitting on docking station 60 with carrier legs 47 and 48 in recessed area 62. Recessed area 62 and the lengths and spacing apart of legs 47 and 48 are dimensioned to prevent carrier 40 from moving around in recessed area 62.

Figure 11:
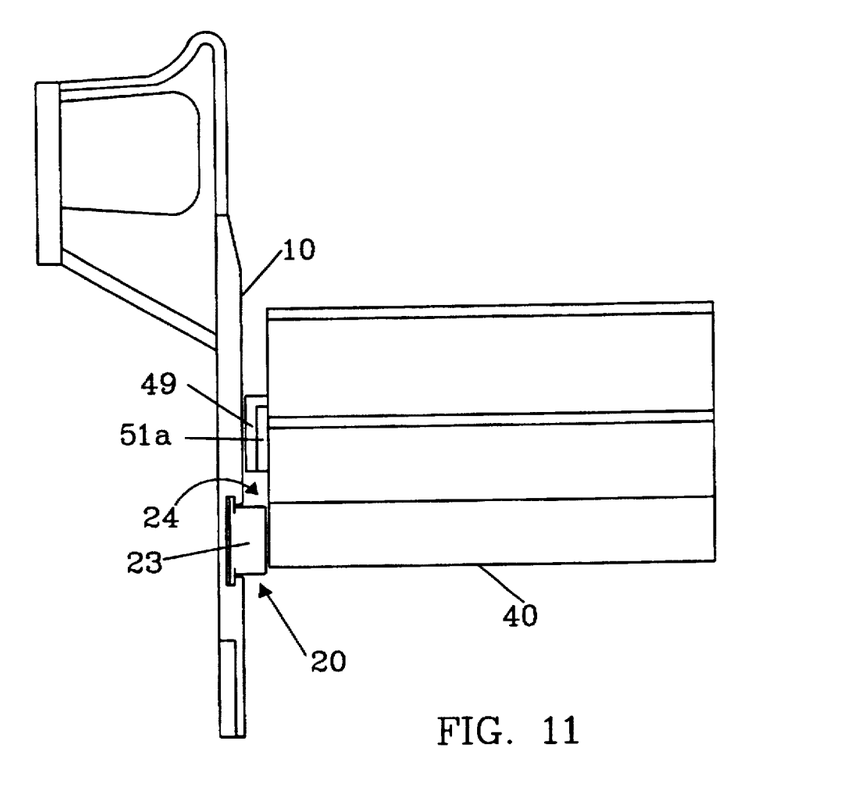
FIG. 11 shows a handle and wafer carrier prior to attaching the handle to the wafer carrier.

FIG. 11 shows a wafer carrier 40 adjacent to a handle 10 with bracket 49, and opening 51a positioned above one end of "C" shaped part 20 and end 23 below bracket 49. As carrier 40 is lowered, part 24, attached to part 23 slides into opening 51a. Similarly, part 22 (FIG. 1) slides into opening 50a (FIG. 4) holding carrier 40 secured on handle 10.

Figure 12:
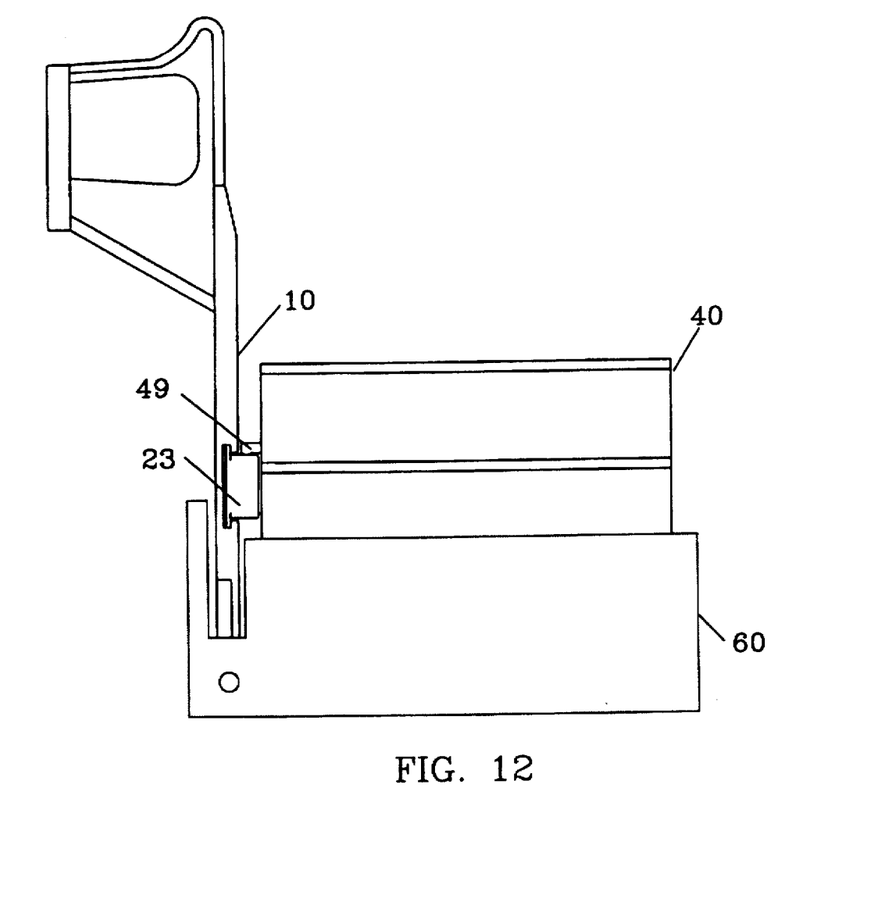
FIG. 12 shows the handle attached to the wafer carrier.

FIG. 12 shows handle 10 and carrier 40 attached together with bracket 20 ends 22 and 23 in the brackets 49 and 50 on the end of carrier 40. Carrier 40 is sitting in recessed area 62 on docking station 60, and legs 18 and 19 of handle 10 are in slot 65.

What is claimed:

1. A semiconductor handling apparatus including a handle device for attaching to and lifting semiconductor wafer carriers from a single end, wherein the carrier has two spaced apart slots on one end; and a docking station for said carrier; wherein said handle comprises:

a linear handle tapered from a small end to a larger mid-section, and terminating in a section that tapers to two spaced apart legs;

a looped handle on said small end; and a bracket device, mounted on said larger mid-section, having on each end a first section extending vertically from the mid-section, and a second section extending at an right angle from said first section;

wherein said second sections extending at a right angle from said first sections are insertable into the spaced apart slots on said wafer carrier for lifting and carrying said wafer carrier.

2. The handling apparatus according to claim 1, wherein said handle is made from a chemical resistant plastic.

3. The handle apparatus according to claim 1, wherein the larger mid-section includes a transverse slot, and said bracket device is mounted in said slot.

4. The handling apparatus according to claim 1, wherein said docking station comprising:

a rectangular box structure having a top surface;

a recessed area in said top surface for receiving a wafer carrier;

a stepped-down area on one end of said top surface; and a slot in said stepped-down area for receiving the spaced apart legs of said handle device.

5. The handling apparatus according to claim 4, wherein said docking station includes a vertical wall mounted on said stepped-down area.

6. The handling apparatus according to claim 4, wherein said docking station box structure is hollow forming a container, and includes a plurality of drain holes in said recessed area for passing wafer processing chemicals from a wafer carrier mounted on said docking station into said container.

7. The handling apparatus according to claim 1, wherein said looped handle on said small end includes a re-enforcing web with an opening therein for receiving a part of the hand for lifting said handle and an attached wafer carrier.

8. A semiconductor handling apparatus including a handle device for attaching to and lifting semiconductor wafer carriers from a single end, wherein the carrier has two spaced apart slots on one end; and a docking station for said carrier; wherein said handle comprises:

a linear handle tapered from a small end to a larger mid-section, and terminating in a section that tapers to two spaced apart legs;

a looped handle on said small end;

a bracket device, mounted on said larger mid-section, having on each end a first section extending vertically from the mid-section, and a second section extending at a right angle from said first section;

wherein said second sections extending at a right angle from said first sections are insertable into the spaced apart slots on said wafer carrier for lifting and carrying;

said docking station comprising:

a rectangular box structure having a top surface;

a recessed area in said top surface for receiving a wafer carrier;

a stepped-down area on one end of said top surface; and a slot in said stepped-down area for receiving the spaced apart legs of said handle device.

9. The handling apparatus according to claim 8, wherein said handle is made from a chemical resistant plastic.

10. The handle apparatus according to claim 8, wherein the larger mid-section includes a transverse slot, and said bracket device is mounted in said slot.

11. The handling apparatus according to claim 8, wherein said docking station includes a vertical wall mounted on said stepped-down area.

12. The handling apparatus according to claim 8, wherein said docking station box structure is hollow forming a container, and includes a plurality of drain holes in said recessed area for passing wafer processing chemicals from a wafer carrier mounted on said docking station into said container.

13. The handling apparatus according to claim 8, wherein said looped handle on said small end includes a re-enforcing web with an opening therein for receiving a part of the hand for lifting said handle and an attached wafer carrier.

* * * * *